(12) United States Patent
Jensen et al.

(10) Patent No.: US 10,182,509 B1
(45) Date of Patent: Jan. 15, 2019

(54) WEDGE CLAMP FOR CIRCUIT BOARD

(71) Applicant: Simon Industries, Inc., Raleigh, NC (US)

(72) Inventors: Moses Ray Jensen, Austin, TX (US); Zachariah Green Renn, Clayton, NC (US); Mark Roger Pelillo, Wake Forest, NC (US); James Christopher Caylor, Chapel Hill, NC (US); Basil Tsiaousopoulos, Cary, NC (US); David R F Stone, Raleigh, NC (US)

(73) Assignee: Simon Industries, Inc., Raleigh, NC (US)

( * ) Notice: Subject to any disclaimer, the term of this patent is extended or adjusted under 35 U.S.C. 154(b) by 0 days.

(21) Appl. No.: 15/968,115

(22) Filed: May 1, 2018

Related U.S. Application Data

(60) Provisional application No. 62/608,126, filed on Dec. 20, 2017.

(51) Int. Cl.
*H05K 7/14* (2006.01)
*F16B 2/14* (2006.01)

(52) U.S. Cl.
CPC ............ *H05K 7/1404* (2013.01); *F16B 2/14* (2013.01)

(58) Field of Classification Search
None
See application file for complete search history.

(56) References Cited

U.S. PATENT DOCUMENTS

| | | |
|---|---|---|
| 3,970,198 A | 7/1976 | Prater |
| 4,824,303 A | 4/1989 | Dinger |
| 5,407,297 A | 4/1995 | Hulme et al. |
| 6,615,997 B2 | 9/2003 | Danello et al. |
| 6,687,130 B2 | 2/2004 | Adams, Sr. et al. |
| 7,046,506 B2 | 5/2006 | Olzak |
| 8,456,846 B2 | 6/2013 | Mosier et al. |
| 2016/0353597 A1 | 12/2016 | Gilmore |

FOREIGN PATENT DOCUMENTS

| | | |
|---|---|---|
| DE | 7016769 U | 8/1970 |
| WO | WO 2006/129004 A2 | 7/2006 |

OTHER PUBLICATIONS

Birtcher Wedge-Lok Series 40-5: Five-Piece, .225×.260 specs, birtcherproducts.com, pp. 18 & 19, believed to be sold in the U.S. before Dec. 2017.

(Continued)

*Primary Examiner* — Xanthia C Cunningham
(74) *Attorney, Agent, or Firm* — Brinks Gilson & Lione

(57) ABSTRACT

A wedge clamp is provided. The wedge clamp includes wedge members aligned with a shaft and in sliding contact with surfaces of the neighboring wedge members. Some of wedge members each include a finger and a void, with the finger of a first member slidably inserted within the void of a second wedge member and vice versa. The fingers and voids extend at an acute angle, and the fingers and voids of other wedge members extend at another acute angle on an opposite side of a vertical axis. When the shaft is rotated some wedge members vertically translate with respect to the remaining wedge members. When the shaft is rotated in the reverse direction the wedge members translate vertically in the opposite direction returning to an original position. The interaction of the fingers and voids mechanically drive the moved wedge members into the original state.

33 Claims, 17 Drawing Sheets

(56) References Cited

OTHER PUBLICATIONS

Calmark Series 260-"Card-Lok" Retainer (Cold Plate) specs, www.calmark.com, pp. 36 & 37, believed to be sold in the U.S. before Dec. 2017.
Wakefield-vette Wedgelock Data Sheet, .260×.225 profile, C-426D-DS, rev Feb. 2013, 2 pp.
Wakefield-vette Wedgelock Data Sheet, .260×.250 profile, C-426C-DS, rev Aug. 2013, 2 pp.

WEDGE CLAMP FOR CIRCUIT BOARD

CROSS-REFERENCE TO RELATED APPLICATIONS

This application claims priority from U.S. Provisional Application No. 62/608,126, filed on Dec. 20, 2017, the entirety of which is hereby incorporated by reference herein.

BACKGROUND

This disclosure relates to structures to mount printed circuit boards, cards, and other electronic components within packaging to support, enclose, and/or remove excess heat therefrom during use. Removable wedge clamps to frictionally retain components within with respect to rigid housings are well known. Often with extended times in use the wedge clamps may become set in an expanded condition due to the accumulation of dust, debris, environmental factors, or other reasons. It is often difficult to release the wedge clamps when replacement or inspection of the components is desired.

BRIEF SUMMARY

A first representative embodiment of the disclosure is provided. The embodiment includes a releasable clamping device. The device includes first, second, and third wedge members that are aligned between a first configuration where an upper surface of the second wedge member is aligned through a plane with an upper surface of one or both of the first and third wedge members, and can be aligned in a second configuration where the upper surface of the second wedge member is vertically offset from the upper surfaces of the first and third wedge members. The first wedge member comprises a finger disposed at an end portion thereof, the finger includes a first inclined surface that establishes a first end face of the first wedge member and a second inclined surface disposed inboard of the first end surface, the first wedge member further comprises a third inclined surface disposed inboard of the second inclined surface, wherein the second and third inclined surfaces collectively establish a void. The second wedge member includes a finger disposed at an end portion thereof, the finger includes a first inclined surface that establishes a first end of the second wedge member and a second inclined surface disposed inboard of the first end surface, the second wedge member further comprises a third inclined surface disposed inboard of the second inclined surface, wherein the second and third inclined surfaces establish a void, and the second wedge member comprises a fourth inclined surface that establishes a second end of the second wedge member opposite to the first end of the second wedge member. The first, second, and third inclined surfaces of the first and second wedge members are each disposed at a first acute angle with respect to a vertical axis perpendicular to a longitudinal axis through the first wedge member, and the fourth inclined surface of the second wedge member is disposed at a second acute angle with respect to the vertical axis, wherein the first and second acute angles are disposed on opposite sides of the vertical axis. The third wedge member includes a first inclined surface that establishes a first end of the third wedge member, wherein the first inclined surface of the third wedge member is aligned in parallel and in sliding contact with the fourth inclined surface of the second wedge member. The first and second wedge members are aligned such that the finger of the first wedge member extends into the void of the second wedge member and the finger of the second wedge member extends into the void of the first wedge member, and wherein the first inclined surface of the first wedge members makes sliding contact with the third inclined surface of the second wedge member, the second inclined surface of the first wedge member makes sliding contact with the second inclined surface of the second wedge member, and the third inclined surface of the first wedge member makes sliding contact with the first inclined surface of the second wedge member. The finger of the first wedge member slides outwardly from the void in the second wedge member and the finger in the second wedge member slides outwardly from the void in the first wedge member as the first, second, and third wedge members transition from the first configuration toward the second configuration.

A second representative embodiment of the disclosure is provided. The second representative embodiment includes a releasable clamping device. The device comprises first, second, third, fourth, and fifth wedge members that are longitudinally aligned, such that the first wedge member makes sliding contact with the second wedge member, the second wedge member makes sliding contact with the third wedge member, the third wedge member makes sliding contact with the fourth wedge member, and the fourth wedge member makes sliding contact with the fifth wedge member. The first wedge member comprises a finger that slidingly extends within a void defined by the second wedge member, and the second wedge member comprises a finger that slidingly extends within a void defined by the first wedge member, wherein an axis through the finger of the first wedge member is parallel to an axis through the second wedge member, and wherein the axes through the fingers of the first and second wedge members are both aligned at a first acute angle with respect to a vertical axis through the third wedge member. The fourth wedge member comprises a finger that slidingly extends within a void defined by the fifth wedge member, and the fifth wedge member comprises a finger that slidingly extends within a void defined by the fourth wedge member, wherein an axis through the finger of the fourth wedge member is parallel to an axis through the fifth wedge member, and wherein the axes through the fingers of the fourth and fifth wedge members are both aligned at a second acute angle with respect to the vertical axis through the third wedge member. A shaft extends through the first, second, third, fourth, and fifth wedge members, wherein rotation of the shaft in a first direction directs a first force to the finger of each of the second and fourth wedge members in a first direction with a vertical vector component toward an upper surface of each respective second and fourth wedge member to urge the second and fourth wedge members to translate vertically with respect to the first, third, and fifth wedge members such that the upper surfaces of the second and fourth wedge members are vertically above upper surfaces of the first, third, and fifth wedge members. Rotation of the shaft in a second direction opposite from the first direction directs an opposite second force to the finger of each of the second and fourth wedge members in a second direction with a vector component toward a lower surface of each respective second and fourth wedge member, opposite the respective upper surface, to urge the second and fourth wedge members to translate vertically with respect to the first, third, and fifth wedge members such that the upper surfaces of the second and fourth wedge members move toward an orientation where the upper surfaces of the first, second, third, fourth, and fifth wedge members extend through a single plane.

Advantages of the present disclosure will become more apparent to those skilled in the art from the following description of the preferred embodiments of the disclosure that have been shown and described by way of illustration. As will be realized, the disclosed subject matter is capable of other and different embodiments, and its details are capable of modification in various respects. Accordingly, the drawings and description are to be regarded as illustrative in nature and not as restrictive.

DETAILED DESCRIPTION OF THE DRAWINGS AND THE PRESENTLY PREFERRED EMBODIMENTS

Figure 1:
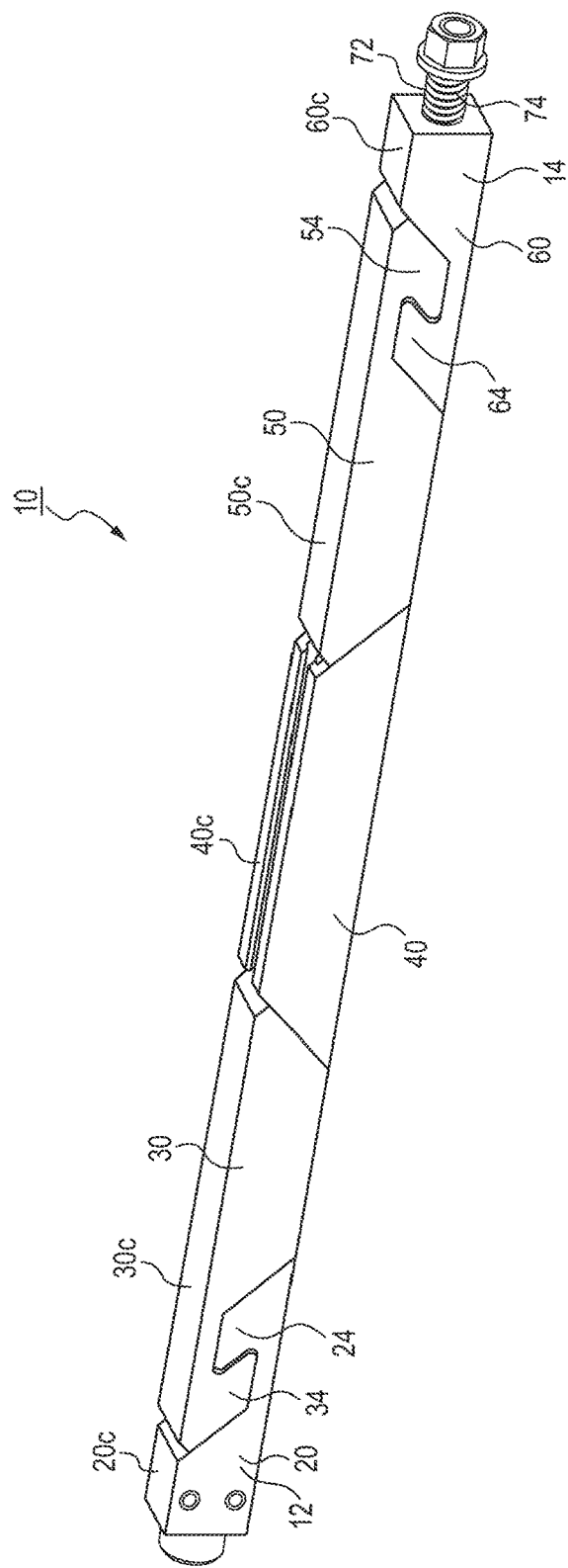
FIG. 1 is a perspective view of a releasable retaining device suitable to retain a printed circuit board within a housing with a frictional connection, depicting the retaining device in compact configuration.
Figure 2:
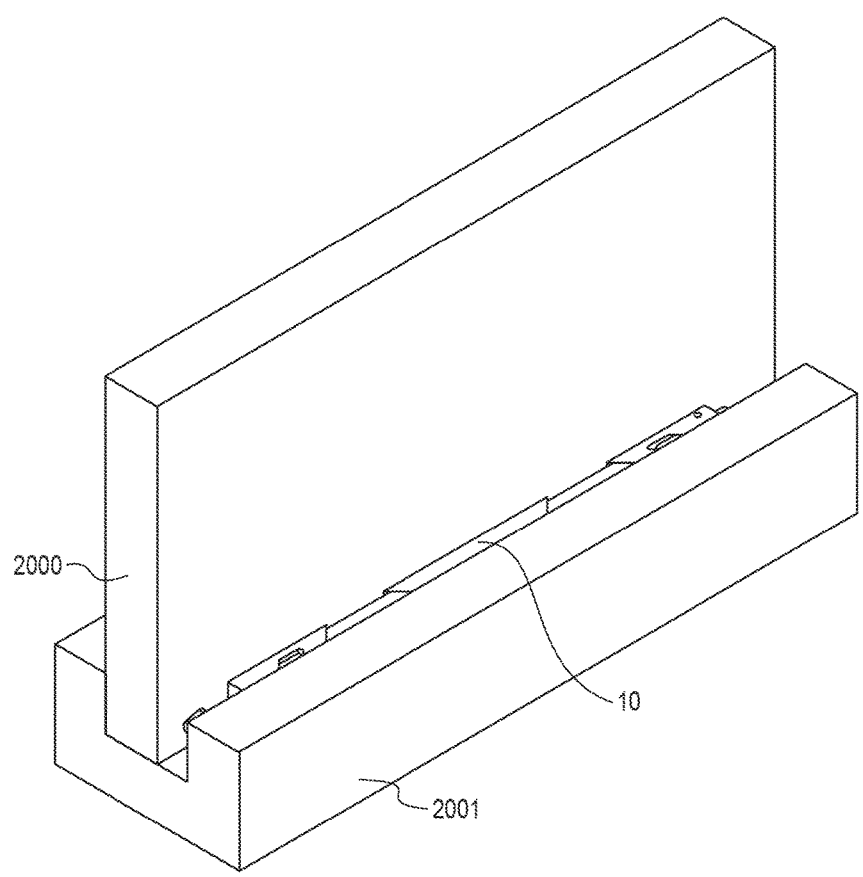
FIG. 2 is a schematic perspective view showing the retaining device aligned to provide compression between a printed circuit board and a rigid housing.
Figure 2A:
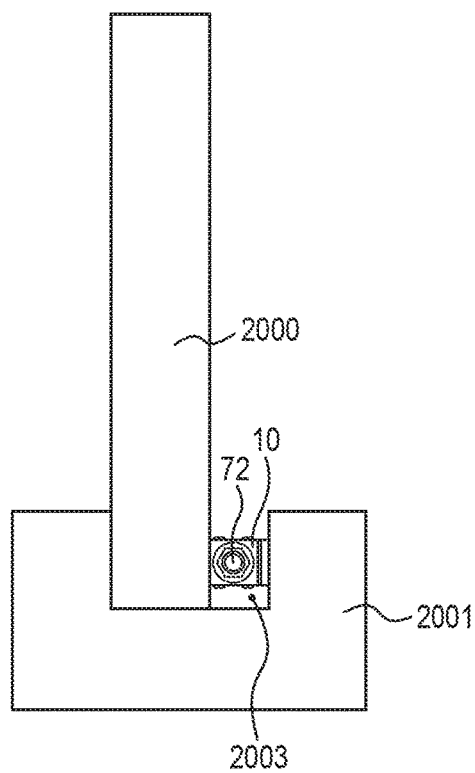
FIG. 2a is an end view of FIG. 2.
Figure 2B:
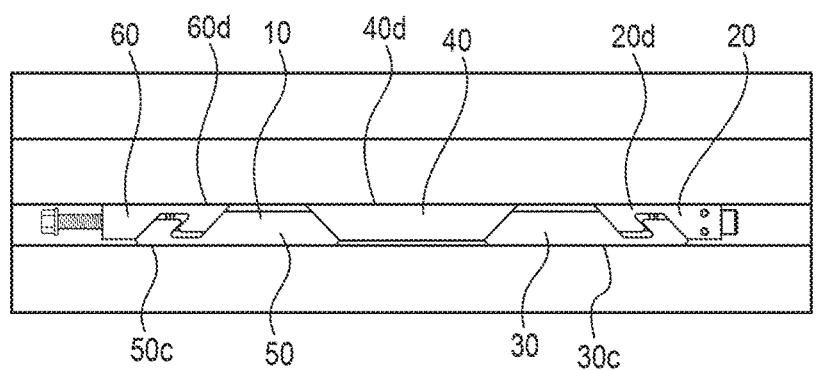
FIG. 2b is a top view of FIG. 2.
Figure 3:
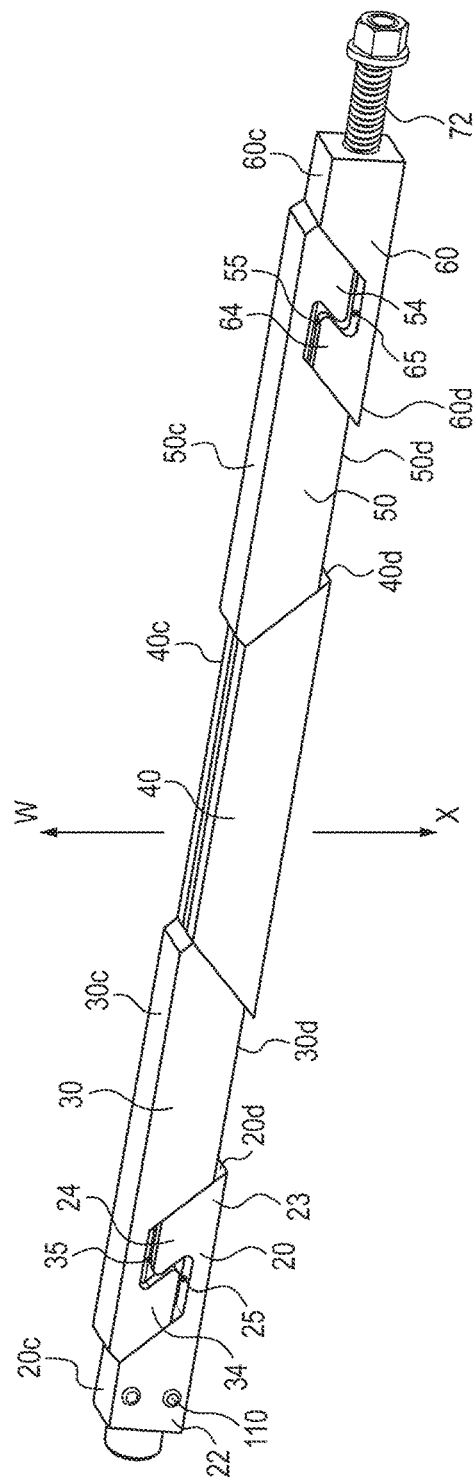
FIG. 3 is a perspective view of the retaining device of FIG. 1, showing the retaining device in an expanded configuration.
Figure 3A:
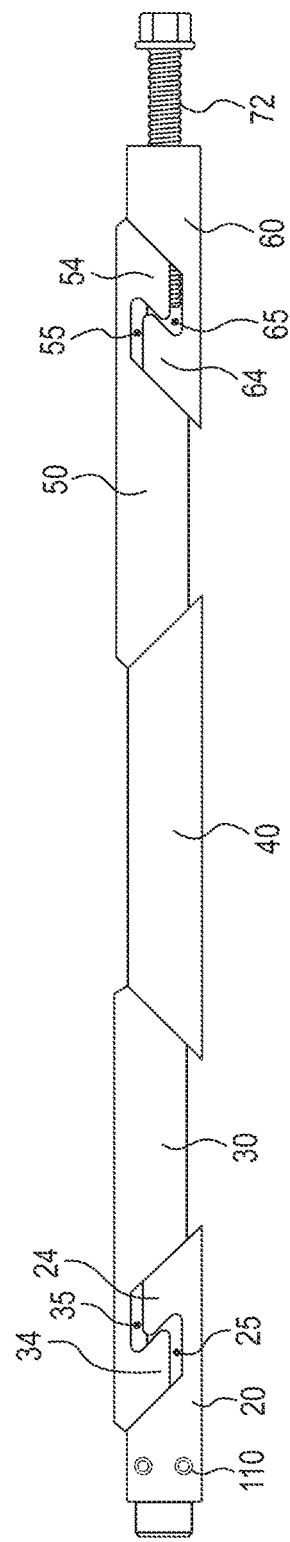
FIG. 3a is a side view of the retaining device of FIG. 3.

Turning now to FIGS. 1-12, a retaining device 10 is provided. The retaining device 10 may be configured to releasably secure a movable component to a rigid structure. In some embodiments, as shown in FIGS. 2-2b, the retaining device 10 may be configured to rigidly support a printed circuit board (PCB) 2000 within a rigid housing, such as an avionics package. In some embodiments, the rigid housing 2001 may be provided to protect the printed circuit board from environmental factors, such as rain, humidity, or temperature cycles. In some embodiments, the rigid housing 2001 may fully enclose the printed circuit board 2000 when disposed therein, while in other embodiments the rigid housing may simply provide rigid alignment to the printed circuit board. The retaining device 10 is configured for long term engagement to retain a printed circuit board 2000 (or similar structure) fixed with respect to the rigid housing 2001, while be releasable when desired to allow for the printed circuit board 2000 to be removed from the rigid housing 2001. In some embodiments, the device may be configured in an expanded configuration to bridge across a space 2003 between the printed circuit board 2000 and the rigid housing 2001 and provide a compressive force upon both to maintain the printed circuit board in the desired position and orientation due to friction. The term rigid housing 2001 as used herein should be broadly understood by one of ordinary skill in the art that reviews this specification to include any structure that is capable of retaining a removable structure, and may be an enclosure, a heat transfer surface (cold plate, finned structure, or the like) or another component. Likewise, the term printed circuit board as used herein should be broadly understood by one of ordinary skill in the art that reviews this specification to include any structure that may be desired to be fixed within a rigid housing, yet capable of being removed for replacement or repair.

Figure 4:
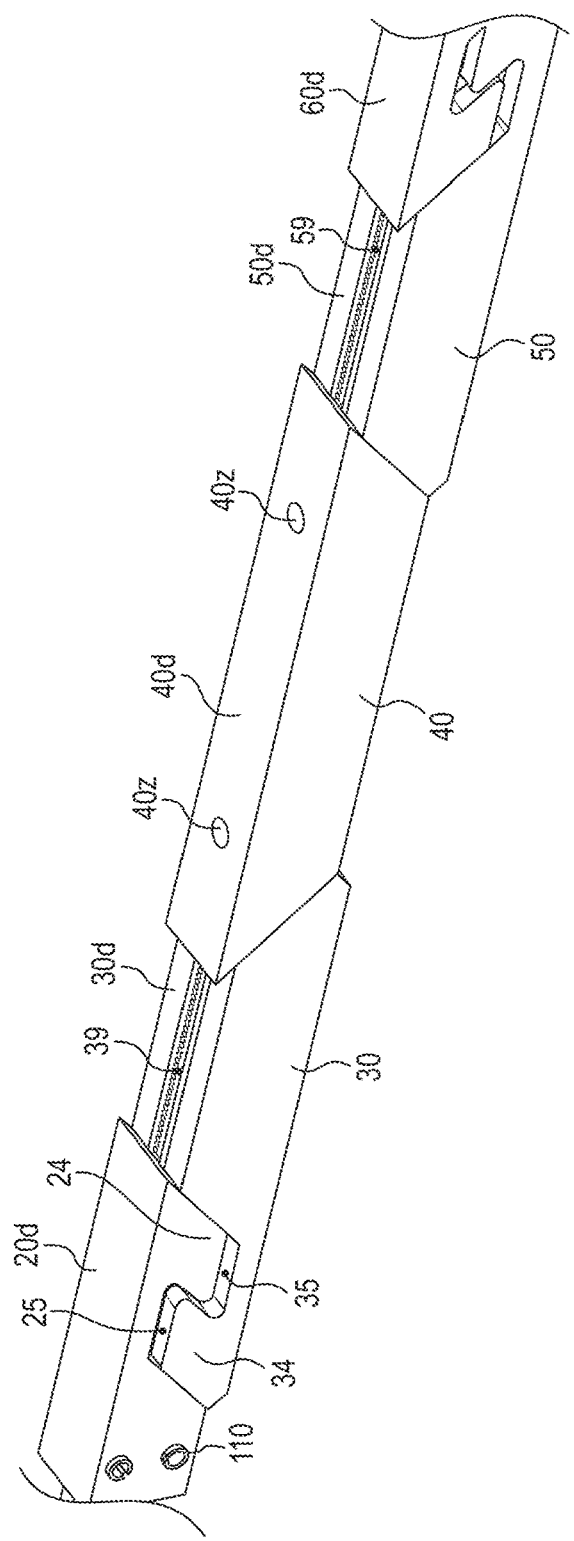
FIG. 4 is a partial perspective view showing the bottom of the retaining device in the expanded configuration.
Figure 5:
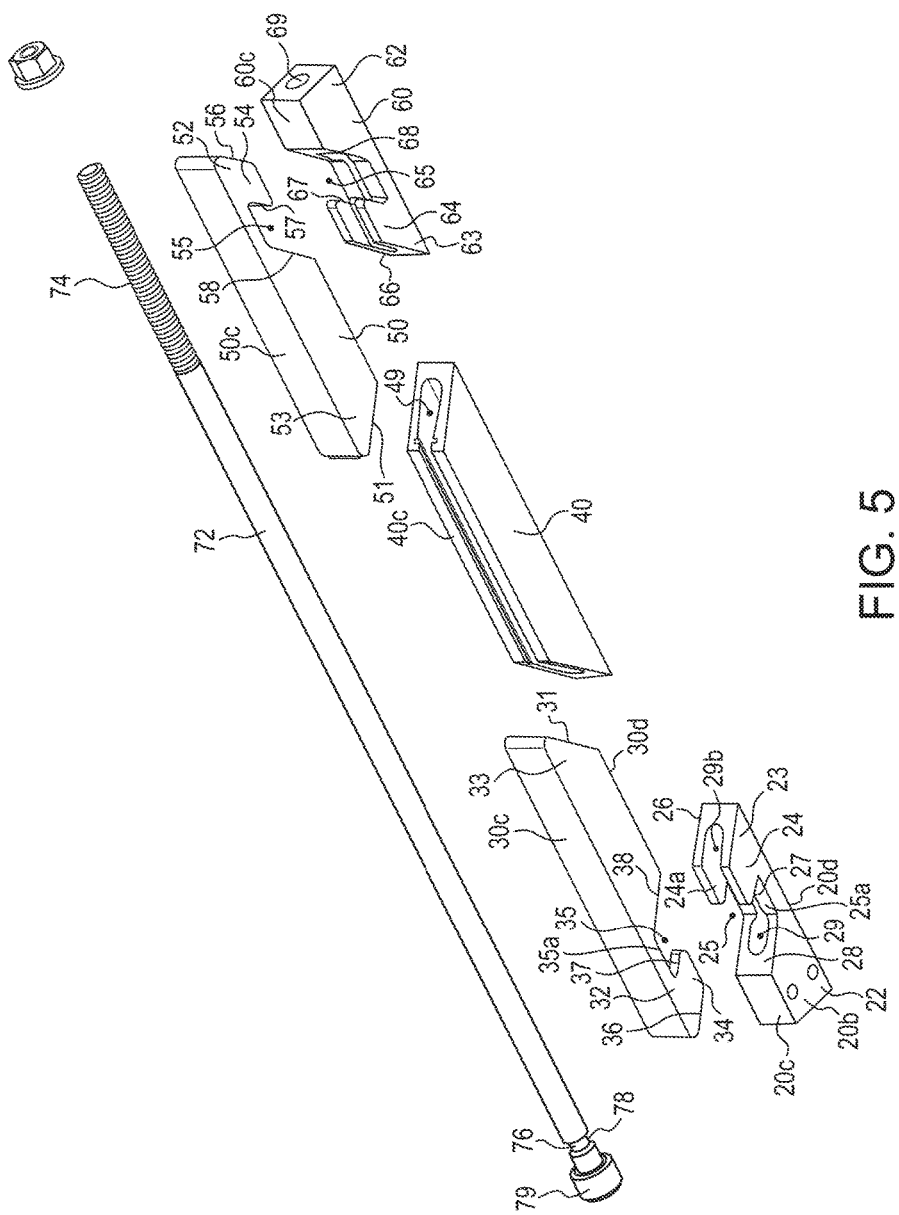
FIG. 5 is an exploded view of the retaining device of FIG. 1.

The retaining device 10 is best shown in FIGS. 1 and 4, and is adjustable between a released (relaxed) configuration (FIGS. 1, 2) and an expanded configuration (FIGS. 4, 5). In the released configuration, the retaining device 10 is in a narrowed, relaxed, alignment (i.e. a narrow width between the "top" surfaces of the device and the "bottom" surfaces of the device). The use of relative terms "top" and "bottom" are relative terms and depending upon the orientation of the retaining device 10 in the environment, the "top" surfaces as defined herein can be oriented at a bottom of the device (as the device is oriented with respect to other structures and in the field of gravity) and the "bottom" surfaces can be oriented at a top of the device. The "top" surface is defined herein to be the surfaces of each component that faces in the direction W (FIG. 3) and the "bottom" surface is defined as the surfaces of each component that face in the opposite direction X. The height is defined as the distance between the top and bottom surfaces.

The retaining device 10 includes multiple fixed components, one or more movable components, and a shaft that urges movement of the movable components with respect to the fixed components (either toward or away from an aligned configuration) based upon rotation of the shaft. In some embodiments, the movable components move in the direction W with respect to the fixed components as the shaft is rotated in a first direction (which increases the overall height of the device between the top surfaces of the movable components and the bottom surfaces of the fixed components) and the movable components move with respect to the fixed components in the direction X when the shaft is rotated in the opposite direction (which decreases the overall height of the device between the top surfaces of the movable components and the bottom surfaces of the fixed components). In some embodiments, when the device is in a first, relaxed state or configuration, the top surfaces of the movable components are aligned along the same plane as the top surfaces of the fixed components and the bottom surfaces of the movable components are aligned along a same plane (parallel to the plane through the collective top components), and when the device is in a second expanded configuration the top surfaces of the movable components are aligned through a plane that is offset from and parallel with the plane through the top surfaces of the fixed components, and likewise a plane through the bottom surfaces of the movable components is offset and parallel with a plane through the bottom surfaces of the fixed components.

In a first embodiment disclosed herein, the device 10 may include five wedge members that are longitudinally aligned along a longitudinal axis 1000 of a shaft 72. In this embodiment, the device includes five wedge members, but one of ordinary skill in the art with a thorough review of the subject specification will readily understand that the device can include less or more wedge members, such as 3, 4, 6, or 7 wedge members so long as the device has two fixed wedge members and at least one wedge member disposed between the two fixed wedge members that can slide upwardly and downwardly (i.e. in the directions W and X) with respect to the fixed wedge members to increase and decrease the overall width of the device.

In the embodiment depicted in FIG. 1, the device 10 includes a first wedge member 20, a second wedge member 30, a third wedge member 40, a fourth wedge member 50, and a fifth wedge member 60, which are aligned from a first end 12 (at a first end portion 22 of the first wedge member 20) to a second end 14 (at the second end portion 62 of the fifth wedge member 60). Each wedge member includes either a through hole, or a cavity which receives the shaft 72 which maintains alignment between the wedge members and as discussed below urges the wedge members to slide along each other. The shaft 72 can be rotated with a screw driver, an Allen wrench or other conventional line of action drivers through a formation formed on a head 79 of the shaft 72. In some embodiments, the shaft 72 may extend through each wedge member, while in other embodiments, the shaft may extend only through two or more of the wedge members. In some embodiments, the shaft may operate in conjunction with other alignment features, such as a bar that extends through two or more of the wedge members to maintain neighboring wedge members in planar alignment.

The first wedge member 20 extends from a first end portion 22 to a second end portion 23, and includes a finger 24 and defines a void 25 therein. The finger 24 extends upwardly from the body 20a of the wedge member and is defined by a first face 26 and a second face 27. In some embodiments, the first face 26 also establishes the end face on the second end portion 23 of the first wedge member, and the second face 27 is disposed inboard from the first face 26. The first and second faces 26, 27 may be parallel and may be inclined. The length of the second face 27 may define the length of the finger, and also defines the depth of the void 25, as discussed below.

Figure 1A:
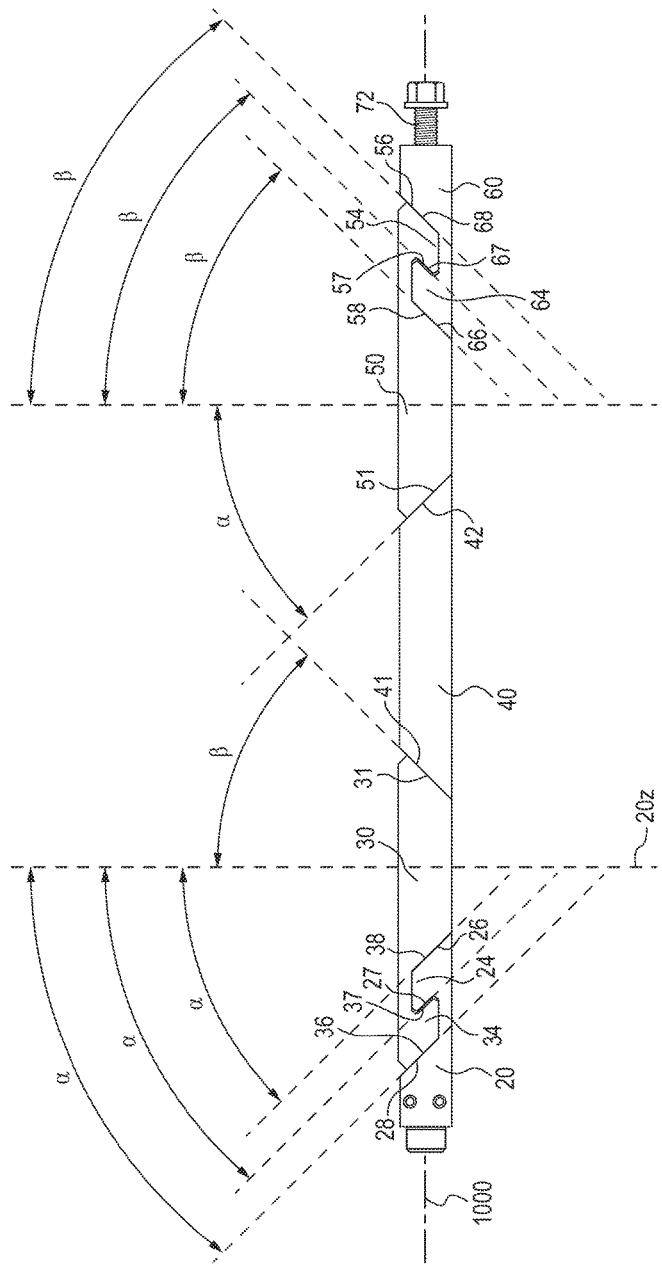
FIG. 1a is a side view of the retaining device of FIG. 1.

The void 25 of the first wedge member 20 may be defined by the second face 27 of the finger and a third face 28 that is located further inboard from the first face 26. The void 25 extends into the body 20a of the first wedge member 20. In some embodiments, the first, second, and third faces 26, 27, 28 may each be parallel with each other and may be inclined and extend at an angle $\alpha$ with respect to a vertical axis 20z through the longitudinal axis 1000 of the shaft 72. The vertical axis 20z is shown in FIG. 1a as passing through the upper and lower faces 30c, 30d of the second wedge member 30 and another axis is shown as passing through the fourth wedge member 50, although the vertical axis can pass through any structure in the device. In some embodiments, the angle $\alpha$ may be 45 degrees, or about 45 degrees, or the angle may be 40 degrees, about 40 degrees, 50 degrees, about 50 degrees, 60 degrees, or about 60 degrees. In other embodiments, the angle $\alpha$ may be within a range of between about 15 to 75 degrees, or in some embodiments, about 30 degrees to about 60 degrees, or in some embodiments about 40 degrees to about 50 degrees inclusive of all angles within these ranges. The term "about" as used herein is specifically defined to refer to the reference value modified by the term "about" including a range of plus or minus 5% of the reference value.

The first wedge member 20 may include a hole 29 that extends through the body 20a of the first wedge member 20. The hole 29 is configured to receive the shaft 72 therethrough. In some embodiments the hole 29 may extend through the entire length of the first wedge member 20 (from the first end portion 22 to the second end portion 23), while in other embodiments, the hole 29 may extend through the first end portion 22, but be aligned so that an axis of the hole extends through the void 25, with the diameter of the hole 29 either being fully incorporated within the void 25 or partially incorporated by the void. In some embodiments, the hole 29 may extend through the finger 24, while in other embodiments, the finger 29 may include a channel 29b that extends through the finger 24 (instead of the hole 29) (such that the upper end face 24a of the finger 24 is bifurcated on opposite sides of the channel 29b).

The second wedge member 30 extends from a first end portion 32 to a second end portion 33 and defines a finger 34 and a void 35. The finger 34 of the second wedge member 30 is configured to be slidingly received within the void 25 of the first wedge member 20 while the finger 24 of the first wedge member 20 is configured to be received within the void 35 of the second wedge member 30. The finger 34 is defined from a first face 36 that defines the end face at the first end portion 32 of the second wedge member 30 and a second face 37 that is disposed inboard of the first face (i.e. in the direction of the second end portion 33). The void 35 is defined between the second face 37 and a third face 38 that is disposed yet still inboard of the second face. The void 35 extends into the body 30a of the second wedge member 30. In some embodiments, the first, second, and third faces 36, 37, 38 may be parallel with each other and may each extend at the angle $\alpha$ with respect to a vertical axis.

The second wedge member 30 includes an upper face 30c and a lower face 30d which are positioned with respect to the assembled configuration of the device, where the upper face 30c faces in the direction W and the lower face 30d faces in the direction X.

The first and second wedge members 20, 30 are configured to be slidable with respect to each other between a first, compact position, where the finger 24, 34 of each wedge member is fully inserted within the void 25, 35 of the respective other wedge member. In some embodiments, the fingers and voids are sized such that when in the first compact position the end face 24a of the finger 24 of the first wedge member 20 contacts a bottom face 35a of the void 35 on the second wedge member 30 and vice versa with the second finger into the first void. In other embodiments the respective fingers 24, 34 may be sized to be somewhat smaller than the depth of the opposite voids 25, 35 so that a space exists between the end face and the bottom face of the opposite void when in the compact configuration.

The first and second wedge members 20, 30 are configured to be slidable vertically, toward a second extended position with respect to each other such that a larger space exists between the end face 24a of the finger 24 and the bottom face 35a of the opposite void 35, and such that an upper face 30c of the second wedge member 30 is spaced above the upper face 20c of the first wedge member 20. In some embodiments, the upper face 30c of the second wedge member 30 is maintained parallel to the upper face 20c of the first wedge member 20 as the second wedge member 30 slides toward and ultimately reaches the extended position, while in other embodiments, the two upper faces are not parallel to each other.

As the first and second wedge members 20, 30 are urged to slide with respect to each other, as discussed below, the first end face 26 of the first wedge member 20 slides along the third face 38 of the second wedge member, and/or the third face 28 of the first wedge member 20 slides along the first end face 36 of the second wedge member 30. In some embodiments, both the surfaces 26/38 and 28/36 slide along each other as the first and second wedge members 20, 30 slide toward the expanding state, while in some embodiments only one of the sets of surfaces may slide along each other due to design constraints or manufacturing tolerances. The corresponding surfaces for neighboring wedge members that make sliding contact with each other are also surfaces upon which forces are transferred (ultimately due to the rotation of the shaft 72) to urge the second wedge member 30 to translate with respect to the first wedge member 20 (and the third wedge member 40, discussed below) between the compact and the expanded positions.

In some embodiments, the second face 27 of the first wedge member 20 and the second face 37 of the second wedge member 30 also slide with respect to each other, but may or may not be in contact with each other as the first and second wedge members slide toward the expanded configuration. In these embodiments, as discussed in further detail below, the second faces 27, 37 of the first and second wedge members 20, 30 may slide along each other as the forces (F3, and related force F4 between the fourth and fifth wedge members 50, 60, discussed below) are applied to urge the device toward the relaxed configuration.

The second wedge member 30 may include a longitudinal channel 39 that extends along the length thereof to receive the shaft 72, and to allow the second wedge member 30 to translate vertically with respect to the shaft 72. The longitudinal channel may extend along the entire length of the wedge member (including through the finger) such that the bottom surface 30d is bifurcated by the channel 39.

The second end portion 33 of the second wedge member 30 may include a second end face that is inclined and extends at a second angle β with respect to the vertical axis. In some embodiments, the second angle β is disposed on the opposite side of the vertical axis from the angle α, and in some embodiments, the angle β may be the same magnitude as the angle α.

The second end face 31 of the second wedge member 30 may make sliding contact with a first end face 41 of a third wedge member 40. The third wedge member may extend from the first end face 41 to a second end face 42 at an opposite end of the third wedge member 40 from the first end face 41. In some embodiments, the first end face 41 may also extend at the angle β with respect to vertical axis, such that the second end face 31 of the second wedge member 30 makes sliding contact with the first end face 41 of the third wedge member 40.

The third wedge member may include a longitudinal aperture 49 that extends along the length of the third wedge member 40 and provides for the shaft 72 to extend therethrough. In some embodiments, the aperture 49 may be a hole that is of a diameter only slightly larger than the diameter of the shaft 72 to prevent relative vertical motion of the third wedge member 40 with respect to the shaft 72. In other embodiments, the aperture 49 may be a channel that opens along the upper surface 40c of the third wedge member to bifurcate the upper surface 40c therebetween.

The second end face 42 of the third wedge member 40 is configured to make sliding contact with the fourth wedge member 50. The second end face 42 may be disposed at the same angle α as the first, second, and third surfaces 26, 27, 28 make with a vertical axis, such that the second end face 42 makes an angle with the vertical axis that is opposite from the angle β that the first end face 41 makes with the vertical axis.

The fourth wedge member 50 and the fifth wedge member 60 may be provided and in some embodiments may be constructed in the same manner as the second wedge member 30 and the first wedge member 20, respectively and oriented in an opposite direction as the second wedge member 30 and the first wedge member 20 along the device 10 and disposed with the shaft 72 therethrough. The naming convention for the similar components and surfaces of the respective first and fifth wedge members 20, 60 and the respective second and fourth wedge members 30, 50 is maintained herein. For example, the first end face 26 of the first wedge member (i.e. the face that defines the finger 24 and forms the face of the second end portion 23, and slides along the third face portion 38 of the second wedge member 30) corresponds to the first end face 66 of the fifth wedge member 60, which slides along the third face portion 58 of the fourth wedge member 50. Any potential differences between the first and fifth wedge members 20, 60 and the second and fourth wedge members 30, 50 are discussed below.

In summary, fifth wedge member 60 may define a finger 64 and a void 65 that are similar to the finger 24 and void 25 of the first wedge member, and similarly the fourth wedge member 50 may define a finger 54 and a void 55 that are similar to the finger 34 and void 35 of the second wedge member 30. A difference between the respective fourth and fifth wedge members 50, 60 from the respective second and first wedge members 30, 20 is that the respective first, second and third faces (56, 57, 58 and 66, 67, 68) each extend at an acute angle with respect to the vertical axis, which may be the angle β discussed above, which extends on an opposite side of the vertical axis from the acute angle α. As with the first and second wedge members 20, 30, the fifth and fourth wedge members 60, 50 are aligned such that a finger 64 of the fifth wedge member 60 is slidingly received within a void 55 of the fourth wedge member 50 and vice versa. Also, as with the first and second wedge members 20, 30, the distance from an end face of the finger from a bottom face of the void changes as the fourth and fifth wedge members 50, 60 slide between the first compact position and the expanded position due to rotation of the shaft, as discussed below.

As with the first and second wedge members 20, 30, as the fourth and fifth wedge members 50, 60 are urged to slide with respect to each other, as discussed below, the first end face 66 of the fifth wedge member 60 slides along the third face 58 of the fourth wedge member, and/or the third face 68 of the fifth wedge member 60 slides along the first end face 56 of the fourth wedge member 50. In some embodiments, both the surfaces 66/58 and 68/56 slide along each other as the fourth and fifth wedge members 50, 60 slide toward the expanding state, while in some embodiments only one of the sets of surfaces may slide along each other due to design constraints or manufacturing tolerances. In some embodiments, the second face 67 of the fifth wedge member 60 and the second face 57 of the fourth wedge member 50 also slide with respect to each other, but may or may be not in contact with each other as the first and second wedge members slide toward the expanding state. These surfaces that make sliding contact with each other are also surfaces upon which forces are transferred (ultimately due to the rotation of the shaft 72) to urge the fourth wedge member 50 to translate with respect to the fifth wedge member 60 (and the third wedge member 40) between the compact and the expanded positions.

The fourth wedge member 50 may include a longitudinal channel 59 that extends along the length thereof to receive the shaft 72, and to allow the fourth wedge member 50 to translate vertically with respect to the shaft 72. The longitudinal channel may extend along the entire length of the wedge member (including through the finger) such that the bottom surface 50d is bifurcated by the channel 59.

The fifth wedge member 60 may include a hole 69 that extends through the body 60a of the fifth wedge member 60. The hole 69 is configured to receive the shaft 72 therethrough. In some embodiments the hole 69 may extend through the entire length of the fifth wedge member 60 (from the first end portion 62 to the second end portion 63), while in other embodiments, the hole 69 may extend through the first end portion 62, but be aligned so that an axis of the hole 69 extends through the void 65, with the diameter of the hole 69 either being fully incorporated within the void 65 or partially incorporated by the void. In some embodiments, the hole 69 may extend through the finger 64, while in other embodiments, the finger 64 may include a channel (instead of the hole 69) that extends through the finger 64 (such that the upper end face 64a of the finger 64 is bifurcated on opposite sides of the channel). A portion of the length of the hole 69 may be threaded (such as a tapped hole or with a threaded insert) to receive a threaded portion 74 of the shaft 72 therethrough. The tapped/threaded connection ensures that the fifth wedge member 60 translates toward or away from the first (and third) wedge members 20, 40 depending upon the direction of rotation of the shaft 72, because the fifth wedge member is constrained from rotating along with rotation of the shaft 72. As discussed below, the movement of the fifth wedge member 60 with respect to the shaft as the shaft rotates causes translation of the second and fourth wedge members 30, 50.

Figure 12:
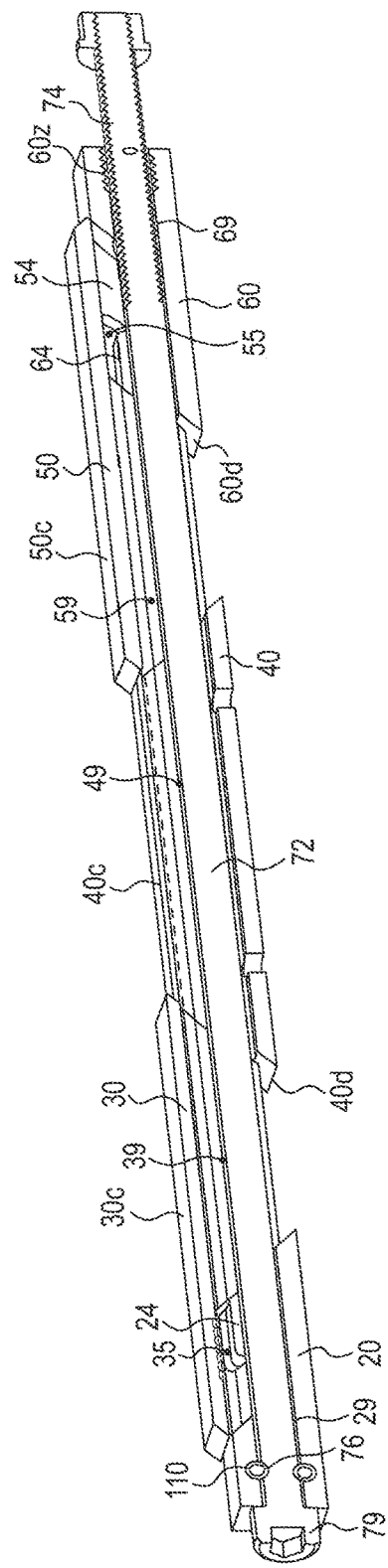
FIG. 12 is a perspective sectional view of the retaining device of FIG. 1 in the expanded position.
Figure 16:
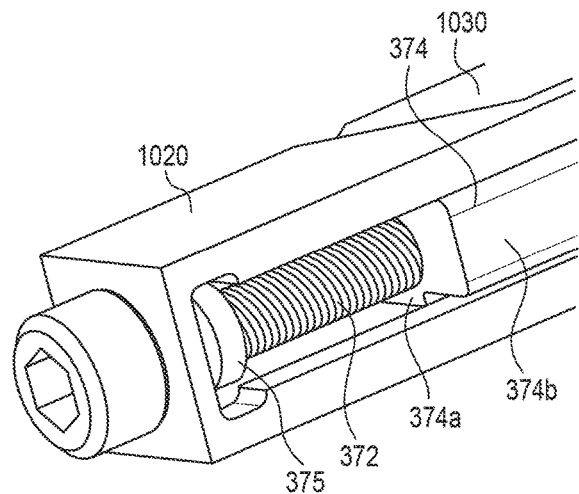
FIG. 16 is another bottom perspective view of the retaining device of FIG. 13 with the device in the extended configuration.

As best shown in FIGS. 1, 5, and 12, in some embodiments, the first wedge member 20 may support one, two, or more retaining features 110 therein that are positioned to extend within or with respect to a formation 78 on the shaft 72 to prevent relative longitudinal (i.e. in a direction parallel to the longitudinal axis 70a of the shaft) motion of the first wedge member 20 with respect to the shaft 72. In some embodiments, the formation 78 may be a circumferential recess 76 in the shaft 72 with the retaining feature 110 extending at least partially within the recess 76. In other embodiments, the formation 78 may be a portion of the shaft with a larger diameter than the remainder of the shaft 72, with retaining feature 110 on one or both sides of the larger diameter portion which also prevents relative longitudinal motion between the shaft 72 and the first wedge member 20. The retaining feature 110 may be a pin, a shaft, a set screw, a C-clip, a washer or partial washer, or the like such as any structure that can be fixed to the first wedge member 20 and engage a portion of the shaft 72 after the shaft has been inserted into the first wedge member 20 for manufacturability and assembly purposes. In some embodiments the retaining member 110 may be a bushing (like bushing 375 in FIG. 16) that is fixed to the shaft 72 and positioned on an opposite side of the front side wall of the first wedge member 20 from the head of the shaft 72. In embodiments discussed below, an alternate movement system may be provided. The movement system may include an input 372 that engages a shaft 374, with movement of the input 372 relative to the shaft 374. The embodiment discussed above can be modified to include the input 372 and shaft 374, instead of the elongate shaft 72 discussed herein. Other input devices that urge the outer wedge members toward each other and away from each other may be implemented as well.

Figure 6:
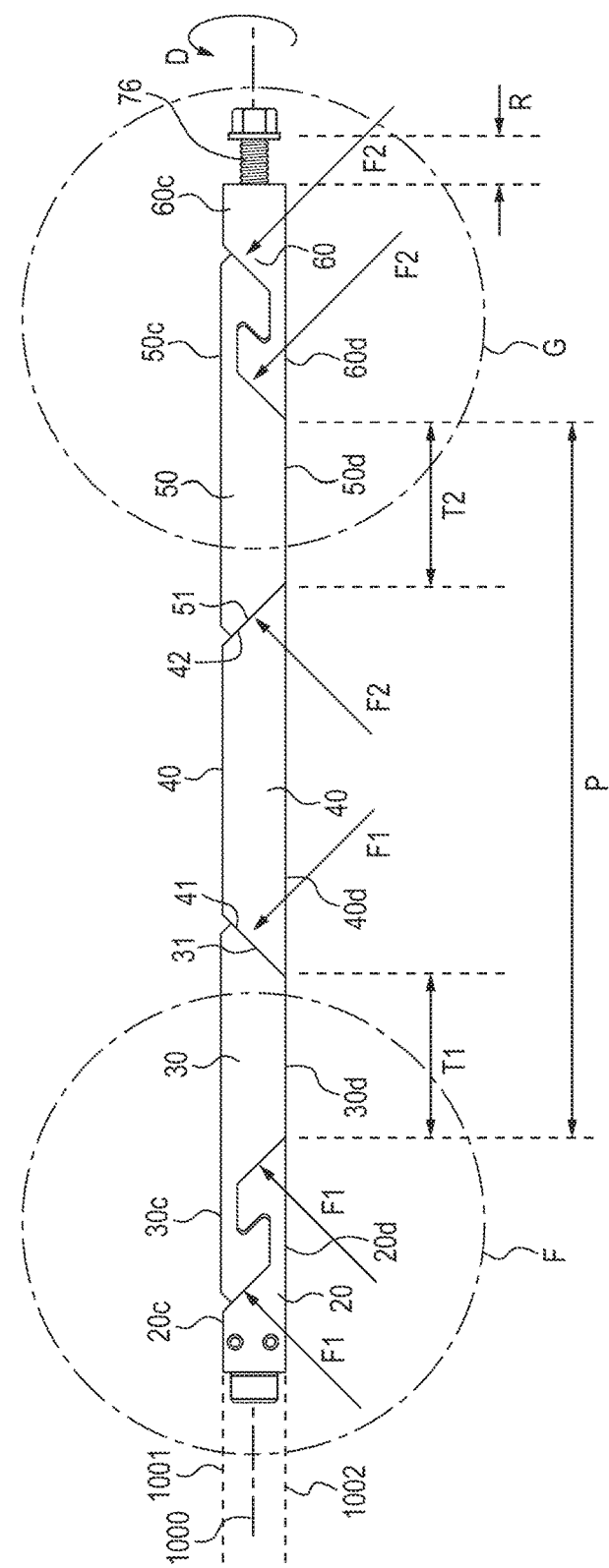
FIG. 6 is a side view of the retaining device of FIG. 1 in the compact configuration and schematically showing the application of forces upon the device as the shaft is rotated in a first direction.

With reference to FIGS. 6-10, the operation of the device 10 is discussed below. As shown in FIG. 6, in the compact configuration, the respective upper faces of each of the wedge members extend along the same plane 1001, or in some embodiments, the upper faces of the second, third, and fourth wedge members 30, 40, 50 extend along the same plane, while the upper surfaces of the first and fifth wedge members 20, 60 are slightly recessed below the remaining upper surfaces. As can also be seen in the figures, the bottom surfaces of each of the wedge members additionally extend along the same plane 1002. In this configuration, the closest spacing between the first and third wedge members 20, 40 (at the bottom edge of the respective first end faces 26, 41) is a distance T1, which is the same as the width of the bottom face 30d of the second wedge member 30. Similarly, the closest spacing between the third and fifth wedge member 40, 60 (at the bottom edge of second end face 42 of the third wedge member 40 and the bottom edge of the first face 66 of the fifth wedge member 60) is a distance T2, which is the same as the width of the bottom face 50d of the fourth wedge member 50. In some embodiments, the distance T1 and T2 are the same, while in other embodiments, the distances T1 and T2 may differ. In this configuration an extended end 76 of the shaft 72 may extend out of the fifth wedge member 60 a distance R.

As the shaft 72 is rotated in a first rotational direction D (which from the configuration in FIG. 6 only a single direction is possible), the fifth wedge member 60, which is threadably engaged with the threaded portion 74 of the shaft 72 is urged toward the first wedge member 20. As the fifth wedge member 60 is urged toward the first wedge member 20, the space P between the first and fifth wedge members 20, 60 decreases. Because the shaft is free to slide with respect to the third wedge member 40, the third wedge member 40 is maintained evenly spaced between the first and fifth wedge members 20, 60, and therefore the distance T1 between the first and third wedge member and the distance T2 between the third and fifth wedge member decreases with continued rotation of the shaft 72 in the first direction D.

Figure 7:
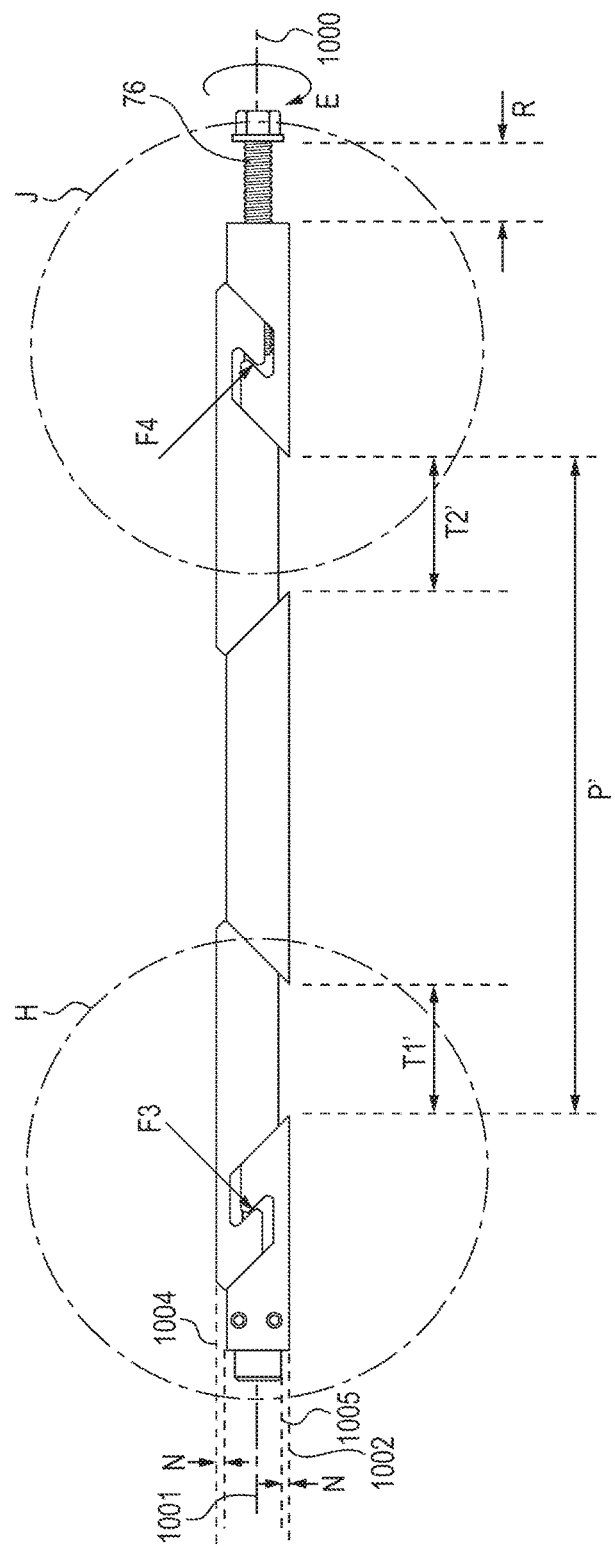
FIG. 7 is a side view of the retaining device of FIG. 1 in the expanded configuration and schematically showing the application of forces upon the device as the shaft is rotated in a second direction.
Figure 8:
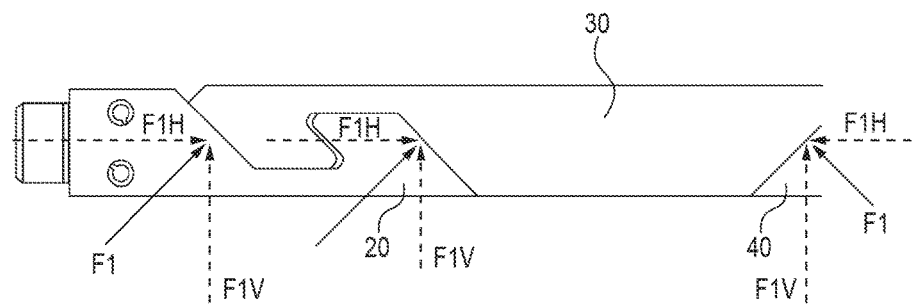
FIG. 8 is a detail view of detail F of FIG. 6.
Figure 9:
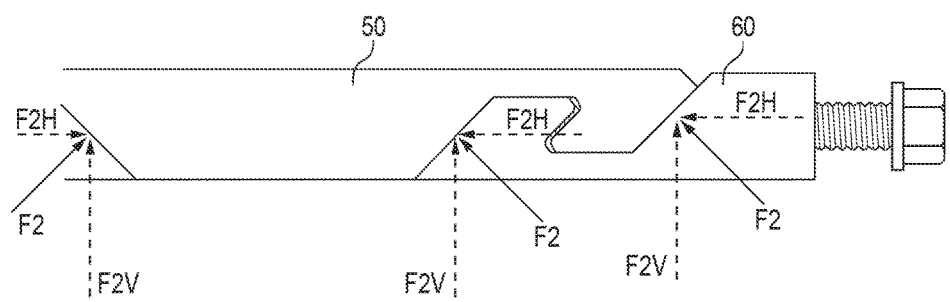
FIG. 9 is a detail view of detail G of FIG. 6.
Figure 10:
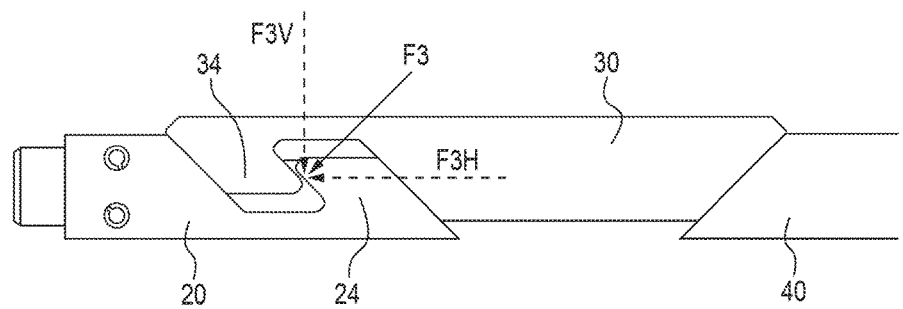
FIG. 10 is a detail view of detail H of FIG. 7.
Figure 11:
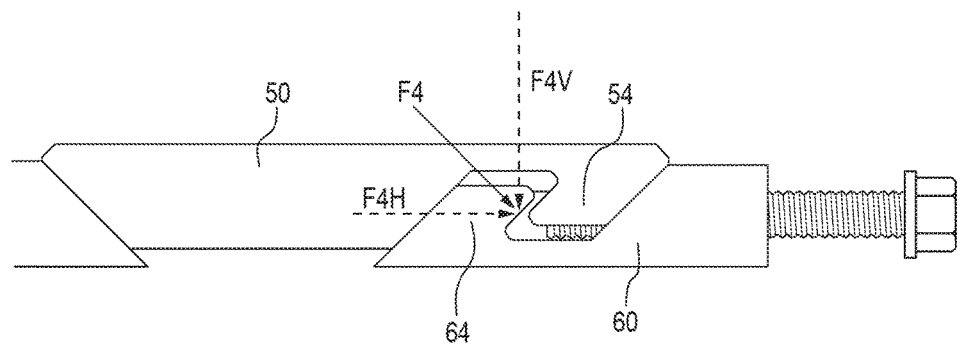
FIG. 11 is a detail view of detail J of FIG. 7.

As the distances T1 and T2 are decreased, a compressive force F1 is applied to the second wedge member 30 from one or both of the first and third wedge members 20, 40, and simultaneously, a compressive force F2 is applied to the fourth wedge member 50 from one or both of the third and fifth wedge members 40, 60. The force F1 may be applied to one or more of the first, third, and fourth surfaces 36, 38, 31 of the second wedge member 30 and the first, third, and fourth surfaces 56, 58, 51 of the fourth wedge member 50. The forces F1 and F2 are applied upon the planar surfaces of the second and fourth wedge members 30, 50 respectively. The forces F1 and F2 each include a horizontal vector component F1H, F2H that applies longitudinal force to translate the respective second and fourth wedge members 30, 50 horizontally. Similarly the forces include a vertical component F1V, F2V (FIGS. 8, 9) that each urge the wedge members 30, 50 to translate upwardly with respect to the first, third, and fifth wedge members 20, 40, 60. As shown in FIG. 7, as the second and fourth wedge members 30, 50 slide upwardly, the space between the first and third wedge members T1', T2' (FIG. 7) becomes less than the earlier space T1, T2 and the distance P similarly decreases to P'. The vector components of the forces F1, F2 are a function of the angles α, β that the inclined faces make with the vertical.

As the second and fourth wedge members 30, 50 move upwardly, the edges forming the ends of the bottom surfaces 30d, 50d of the wedge members contact the respective surfaces of the first, third, and fifth wedge members 20, 40, 60 a distance N above the bottom surfaces of the first, third, and fifth wedge members 20, 40, 60 (as shown between planes 1005 and 1002). The upper surfaces 30c, 50c of the second and fourth wedge members 30, 50 also extend the distance N above the upper surfaces 20c, 40c, 60c of the first, third, and fifth wedge members 20, 40, 60, (as shown between planes 1001 and 1004 on FIG. 7) or in some embodiments, the distance N over the third wedge member 40.

When the shaft 72 is rotated in the opposite direction E, the fifth wedge member 60 is urged longitudinally away from the first wedge member 20, which is constrained from moving with respect to the shaft 72 due to the engagement between the shaft and the retaining feature 110. As the fifth wedge member 60 is urged away from the first wedge member 20, the space P increases. Because the shaft is free to slide with respect to the third wedge member 40, the third wedge member 40 is maintained evenly spaced about the first and fifth wedge members 20, 60, and therefore the distance T1 between the first and third wedge members and the distance T2 between the third and fifth wedge members 40, 60 both increase with continued rotation of the shaft 72 in the second direction E.

As the distances T1 and T2 increase the second surface 27 of the first wedge member imparts a force F3 upon the second surface 37 of the second wedge member 30 and the second surface 67 of the fifth wedge member 60 imparts a force F4 upon the second surface 57 of the fourth wedge member 50. Due to the relative angles α, β of the corresponding surfaces, the forces F3 and F4 each apply a horizontal vector component (F3H, F4H) (FIGS. 10, 11) upon the respective second and fourth wedge members 30, 50 that cause the wedge members to slide longitudinally along with the respective first and fifth wedge members 20, 60, which increases the distances T1 and T2. The forces F3 and F4 also include a vertical vector component (F3V, F4V) (due to the inclines of the faces with respect to the vertical) that acts upon the second and fourth wedge members 30, 50 to urge them in a downward direction. This force urges the second and fourth wedge members 30, 50 downwardly with respect to the shaft 72 and the first, third, and fifth wedge members 20, 40, 60. With continued rotation of the shaft in the direction E, the second and fourth wedge members 30, 50 eventually return to a configuration where the upper surfaces 30c, 50c are aligned within the same plane 1001 as the upper surfaces 20c, 40c, 60c of the first, third, and fifth wedge members 20, 40, 60 (or in some embodiments only the third wedge member 40 as discussed herein).

In some embodiments and as depicted in FIG. 4, portions of the device 10 may be fixed to the PCB 2000, or to one or more components of a housing 2001 that will enclose the PCB 2000. For example, the third wedge member 40 may include one or more apertures 40z that can receive screws or other fasteners to fix the wedge member to the PCB or housing and the relative motion of the first and fifth wedge members 20, 60 toward or away from each other, as discussed above, is also relative motion with respect to the fixed third wedge member 40.

Turning now to FIGS. 13 and 14-17, another embodiment of a retaining device is disclosed. The retaining device includes multiple, such as five, wedge members. While five wedge members are depicted in FIGS. 13 and 14-17, one of ordinary skill in the art will comprehend that additional or fewer wedge members may be provided. Because this embodiment shares many similarities with the embodiments described above, for the sake of brevity, similar components are identified with the same final two digits of the element numbers as the embodiment of retaining device 10, discussed above, and one of ordinary skill in the art will appreciate upon a thorough review of this specification that similar features from both embodiments operate in a similar fashion, unless differences are specifically described herein.

Figure 13A:
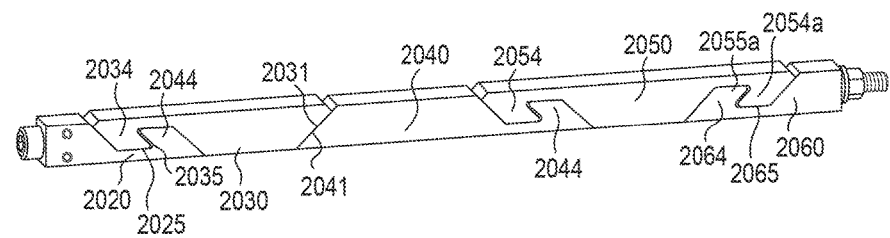
FIG. 13a is a perspective view of another retaining device.
Figure 13:
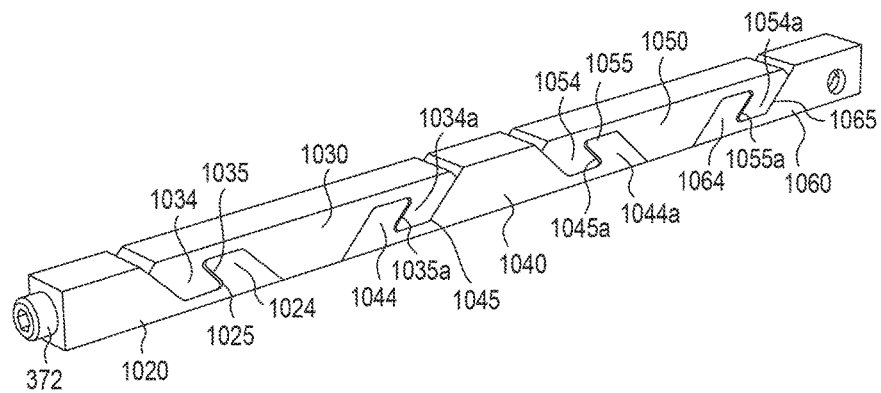
FIG. 13 is a perspective view of another retaining device with the device in a relaxed configuration.

As shown in FIG. 13, the first wedge member 1020 includes a finger 1024 and a first void 1025, similar to the first wedge member 20, discussed above. The second wedge member 1030 includes a first finger 1034 and a first void 1035, which engage the first finger 1024 and first void 1025 of the first wedge member 1020, in the same manner as the respective fingers and voids of the first and second wedge member 20, 30 discussed above. The second wedge member 1030 has a second finger 1034a and a second void 1035a which are disposed on an opposite end of the second wedge member 1030 from the first finger 1034 and void 1035. The third wedge member 1040 includes a first finger 1044 and first void 1045 that engage the second finger 1034a and second void 1035a of the second wedge member 1030. The third wedge member 1040 further includes a second finger 1044a and second void 1045a disposed upon the opposite end of the third wedge member 1040 from the first finger 1044 and first void 1045. A fourth wedge member 1050 includes a first finger 1054 and first void 1055 that engage the second finger and void 1044a, 1045a of the third wedge member 1040. The fourth wedge member 1050 further includes a second finger 1054a and second void 1055a that are disposed upon the opposite end portion of the fourth wedge member 1050. Finally, the fifth wedge member 1060 includes a first finger 1064 and first void 1065 that engages the second finger and void 1054a 1055a of the fourth wedge member.

The interactions between the fingers and voids of the system 1000 is the same as the interaction between the fingers and voids of the first and second wedge members 20, 30 and the fourth and fifth wedge members 50, 60 as discussed above, such that when the first and fifth wedge members 1020, 1060 are urged toward each other, the device moves to the expanded configuration (like FIGS. 2a and 2b, above) and when the first and fifth wedge members are urged away from each other the device moves to the released (relaxed) condition.

In other embodiments like shown in FIG. 13a, another device 2000 may be provided. In this embodiment, the third wedge member 2040 may include a finger and void 2044, 2045 that engages a first finger and first void 2054, 2055 of the fourth wedge member (or the same structure from the second wedge member 2030), while the other end of the third wedge member 2040 includes an inclined surface 2041 that engages a respective opposite inclined surface 2031 from the second wedge member. The remaining components of the device are the same as the similar embodiments discussed herein and like elements are identified with element numbers with the same final two digits as the related elements in other embodiments.

Figure 14:
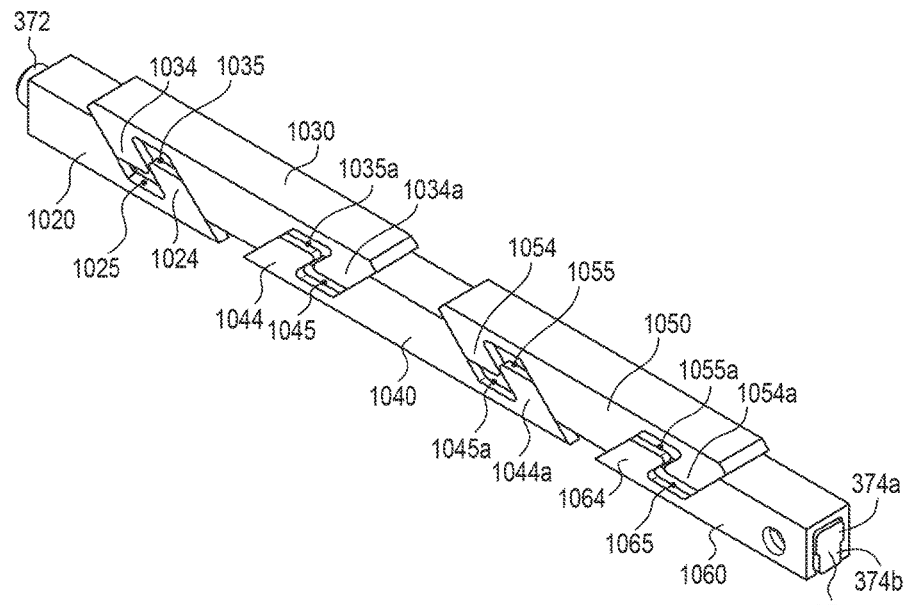
FIG. 14 is another perspective view of the retaining device of FIG. 13 with the device in the extended configuration.

As best shown in FIGS. 13 and 14-18, an input mechanism may be provided to allow the user to modify the device from the relaxed position (FIG. 13) to the expanded configuration (FIG. 14). The input mechanism may include an input 372 and a bar 374 that extends along through each of the wedge members, and is fixed to the fifth wedge member 1060 (or in other embodiments the final wedge member). In some embodiments, the input 372 may be a threaded shaft that extends within a correspondingly threaded hole, such as a blind hole 374c, in the bar 374. The bar 374 may include an upper portion 374a and a lower keyed portion 374b, which has a smaller width than the upper portion 374a. In some embodiments, the first, third, and fifth wedge members 1020, 1040, 1060 (or wedge members where the fingers extend in the direction that the second and fourth wedge members 1030, 1050 translate when device moves toward the extended position) may include a ledge 1121, 1141, 1161 that forms an opening just larger than the width of the keyed portion 374b, but smaller than the width of the upper portion 374a. In some embodiments, the ledge may extend along all or a portion of the length of the respective wedge member. In some embodiments, the ledge of the first wedge member 1020 only extends along the portion with the finger 1024 and void 1025 but does not extends to the end with the hole 1028 that accepts the input therethrough.

Figure 17:
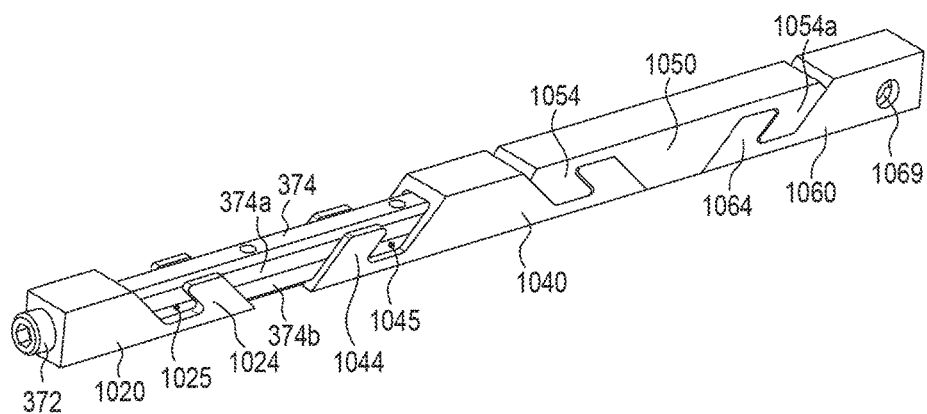
FIG. 17 is the view of the retaining device of FIG. 13 with the second wedge member removed.
Figure 18:
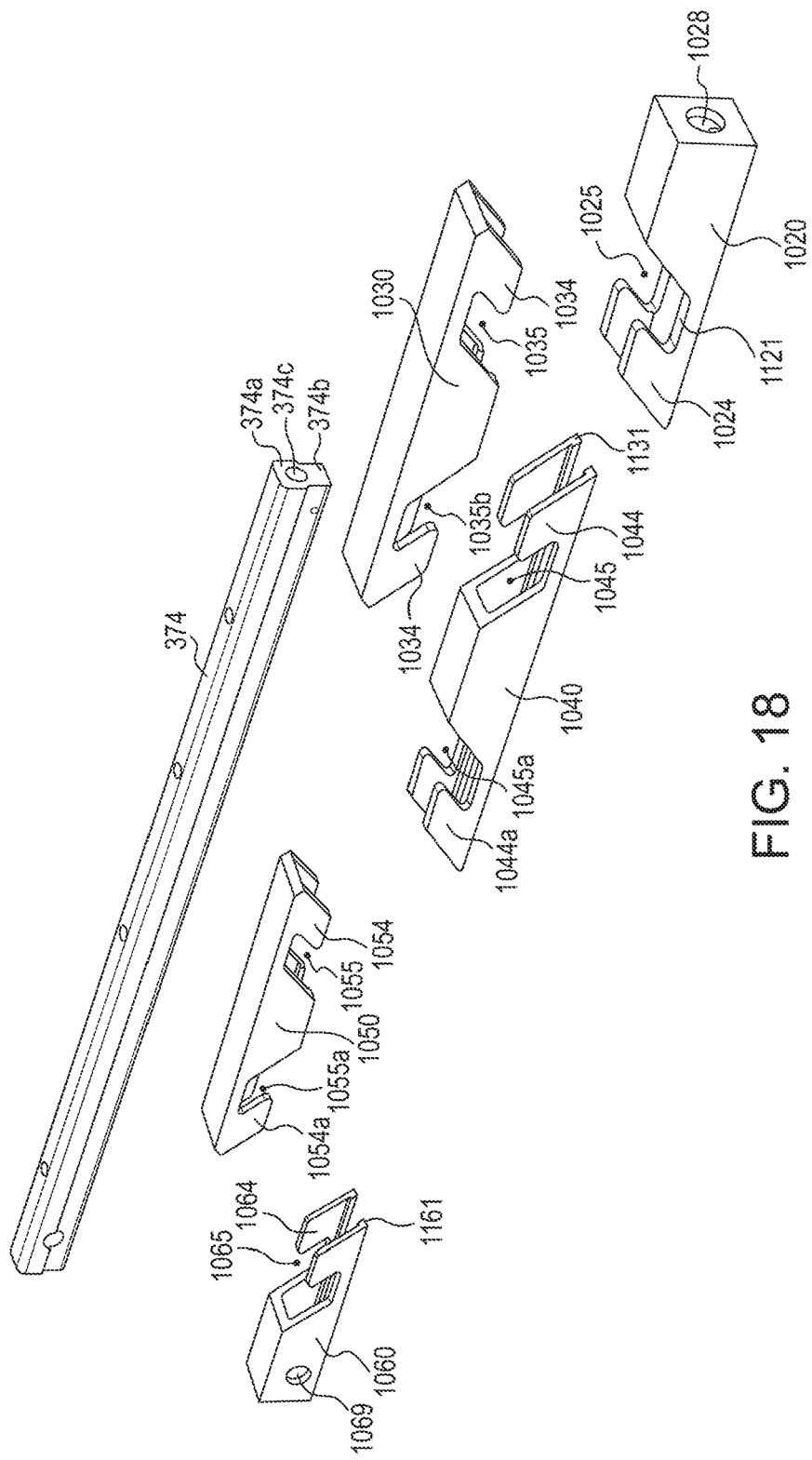
FIG. 18 is an exploded view of the retaining device of FIG. 14.

As best shown in FIGS. 17 and 18, the fifth wedge member 1060 may include an aperture 1069 that allows for a fastener to extend therethrough and engage the bar 374 to prevent relative motion therebetween to fix the position of the bar 374 with respect to the fifth wedge member 1060. In some embodiments, the input 372 may be fixed to the first wedge member 1020 to prevent relative longitudinal motion between the two. The input 372 and first wedge member 1020 may be fixed with a retaining member as discussed above with respect to the first wedge member 20.

Figure 15:
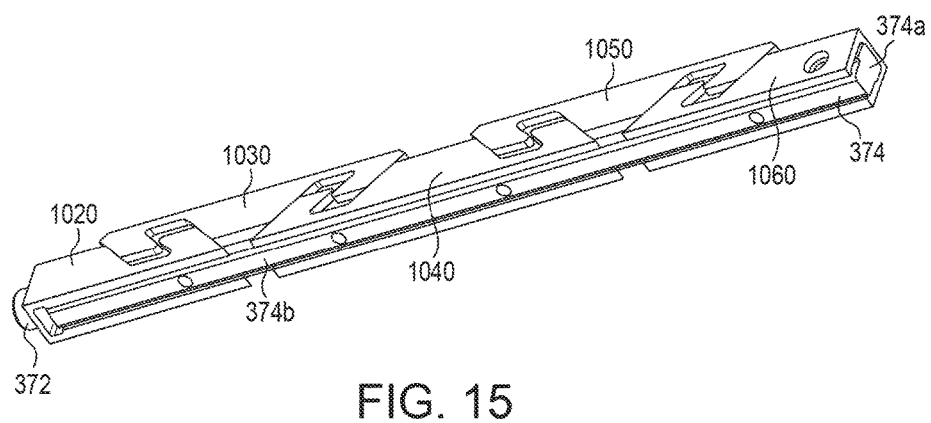
FIG. 15 is a bottom perspective view of the retaining device of FIG. 13 with the device in the extended configuration.

In some embodiments, as shown in FIG. 15, the bar 374 may include one or more apertures 374z that can receive a fastener to fix the bar with respect to the PCB 2000 or the housing 2001, such that the first through fourth wedge members (1020, 1030, 1040, 1050) move with respect to the bar and also with respect to the structure that the bar 374 is fixed to. As discussed above, the fifth wedge member 1060 may be fixed to the bar 374 with a shaft or other device to prevent relative motion between the two components.

While the preferred embodiments of the disclosed have been described, it should be understood that the invention is not so limited and modifications may be made without departing from the disclosure. The scope of the disclosure is defined by the appended claims, and all devices that come within the meaning of the claims, either literally or by equivalence, are intended to be embraced therein.

The invention claimed is:

1. A releasable clamping device, comprising:
   first, second, and third wedge members that are aligned between a first configuration where an upper surface of the second wedge member is aligned through a plane with an upper surface of one or both of the first and third wedge members, and can be aligned in a second configuration where the upper surface of the second wedge member is vertically offset from the upper surfaces of the first and third wedge members;
   wherein the first wedge member comprises a finger disposed at an end portion thereof, the finger includes a first inclined surface that establishes a first end face of the first wedge member and a second inclined surface disposed inboard of the first end surface, the first wedge member further comprises a third inclined surface disposed inboard of the second inclined surface, wherein the second and third inclined surfaces collectively establish a void;
   wherein the second wedge member includes a finger disposed at a first end portion thereof, the finger includes a first inclined surface that establishes a first end of the second wedge member and a second inclined surface disposed inboard of the first end surface, the second wedge member further comprises a third inclined surface disposed inboard of the second inclined surface, wherein the second and third inclined surfaces establish a void, and the second wedge member comprises a fourth inclined surface that establishes a second end of the second wedge member opposite to the first end of the second wedge member,
   wherein the first, second, and third inclined surfaces of the first and second wedge members are each disposed at a first acute angle with respect to a vertical axis perpendicular to a longitudinal axis through the first wedge member, and the fourth inclined surface is disposed at a second acute angle with respect to the vertical axis, wherein the first and second acute angles are disposed on opposite sides of the vertical axis;
   wherein the third wedge member includes a first inclined surface that establishes a first end of the third wedge member, wherein the first inclined surface of the third wedge member is aligned in parallel and in sliding contact with the fourth inclined surface of the second wedge member;
   wherein the first and second wedge members are aligned such that the finger of the first wedge member extends into the void of the second wedge member and the finger of the second wedge member extends into the void of the first wedge member, and wherein the first inclined surface of the first wedge member makes sliding contact with the third inclined surface of the second wedge member, the second inclined surface of the first wedge member makes sliding contact with the second inclined surface of the second wedge member, and the third inclined surface of the first wedge member makes sliding contact with the first inclined surface of the second wedge member,
   wherein the finger of the first wedge member slides outwardly from the void in the second wedge member and the finger in the second wedge member slides outwardly from the void in the first wedge member as the first, second, and third wedge members transition from the first configuration toward the second configuration.

2. The releasable clamping device of claim 1, wherein the first and third wedge members are urged longitudinally toward each other as the first, second, and third wedge members transition from the first configuration toward the second configuration, and the first and third wedge members are urged longitudinally away from each other as the first, second, and third wedge members transition from the second configuration toward the first configuration.

3. The releasable clamping device of claim 2, wherein a first force is transferred from the first inclined surface of the first wedge member to the third inclined surface of the second wedge member and from the third inclined surface of the first wedge member to the first inclined surface of the second wedge member when the first, second, and third members transition from the first configuration to the second configuration, wherein the first force has a horizontal vector component and an upwardly directed vertical vector component, with the vertical vector component causing the second wedge member to translate vertically with respect to the first and third wedge members, and wherein a second force is transferred from the second inclined surface of the first wedge member to the second inclined surface of the second wedge member as the first, second, and third wedge members transition from the second configuration to the first configuration, where the second force has an opposite horizontal vector component and a downwardly directed vertical vector component that urges the second wedge member to translate vertically downward toward vertical alignment with the first and third wedge members.

4. The releasable clamping device of claim 3, wherein the first and second forces extend in opposite directions.

5. The releasable clamping device of claim 2, wherein the longitudinal motion of the first and third wedge members away from each other causes a force to be applied from the second inclined surface of the first wedge member to the second inclined surface of the second wedge member, wherein the force has a vertical vector component that urges the second wedge member to slide with respect to the first and third wedge components such that the upper surface of the second wedge member moves toward the upper surfaces of one or both of the first and third wedge members.

6. The releasable clamping device of claim 5, wherein the force urges the finger of the second wedge member to travel further into the void of the first wedge member and the finger of the second wedge member to slide further into the void of the second wedge member.

7. The releasable clamping device of claim 1, wherein the first inclined surface of the first wedge member is in sliding contact with the third inclined surface of the second wedge member, or the third inclined surface of the first wedge member is in sliding contact with the first inclined surface of the second wedge member as the second wedge member transitions to the second configuration from the first configuration.

8. The releasable clamping device of claim 1, further comprising a rotatable input operatively engaged with the first and third wedge members, wherein rotation of the input in a first direction urges the first and third wedge members toward each other, and rotation of the input in a second direction urges the first and third wedge members away from each other.

9. The releasable clamping device of claim 8, wherein the rotatable input comprises a threaded shaft that is rotatable by a user, and an elongate beam that engages the threaded shaft, the elongate beam extends through the first, second and third wedge members, wherein rotation of the threaded shaft causes relative motion between the elongate beam and first and second wedge members.

10. The releasable clamping device of claim 1, further comprising a shaft that extends through respective longitudinal hollow portions of the first, second, and third wedge members, wherein rotation of the shaft in a first direction urges the first, second, and third wedge members to transition from the first configuration toward the second configuration and rotation of the shaft in a second direction opposite to the first direction urges the first, second, and third wedge members to transition from the second configuration toward the first configuration.

11. The releasable clamping device of claim 9, further comprising a retaining feature disposed through the first member, wherein the retaining feature interacts with an alignment feature of the shaft, such that longitudinal movement of the shaft with respect to the retaining feature is prevented.

12. The releasable clamping device of claim 11, wherein the alignment feature is a circumferential recess in the shaft, wherein the retaining feature is a pin, a shaft, a set screw, or a C-clip, and wherein the retaining feature extends within a space formed by the circumferential recess.

13. The releasable clamping device of claim 8 further comprising fourth and fifth wedge members that are disposed such that a first end surface of the fourth wedge member makes sliding contact with a second end surface of the third wedge member opposite from the first end surface of the third wedge member, and wherein a first end surface of the fifth wedge member makes sliding contact with an inclined surface of the fourth wedge member, wherein the fifth wedge member translates toward or away from the first wedge member with rotation of the rotatable input.

14. The releasable clamping device of claim 13, wherein the rotatable input is a shaft that extends through the first, second, third, fourth, and fifth wedge members, and wherein the fifth wedge member comprises a threaded hole that receives a threaded portion of the shaft therethrough.

15. The releasable clamping device of claim 13, wherein the fifth wedge member is longitudinally fixed with a shaft that extends through each of the first, second, third, fourth, and fifth wedge members.

16. The releasable clamping device of claim 13, wherein the fifth wedge member translates longitudinally toward the first wedge member when the rotatable input is rotated in the first direction, and the fifth wedge member slides longitudinally away from the first wedge member when the rotatable input is rotated in the opposite second direction.

17. The releasable clamping device of claim 13, wherein the fourth wedge member comprises a finger and a void and the fifth wedge member comprises a finger and a void, wherein the finger of the fourth wedge member is slidably disposed within the void of the fifth wedge member, and the finger of fifth wedge member is slidably inserted within the void of the fourth wedge member, wherein the fingers of the fourth and fifth wedge members each extend along an axis that is disposed at the second angle with respect to the vertical axis.

18. The releasable clamping device of claim 13, wherein the first end surfaces of each of the fourth and fifth wedge members extend in parallel to the fourth inclined surface of the second wedge member.

19. The releasable clamping device of claim 1, wherein the first and second angles are each about 45 degrees.

20. The releasable clamping device of claim 1, wherein the first and second angles are each within a range of about 15 degrees to about 75 degrees.

21. The releasable clamping device of claim 8, wherein the device is configured to be disposed between a portion of a printed circuit board and a rigid surface, wherein the device fixes the printed circuit board with respect to the rigid surface with a frictional connection when the rotatable input is fully rotated in the first direction, and wherein the device frees the printed circuit board from the rigid case when the rotatable input is rotated in the second direction.

22. The releasable clamping device of claim 1, wherein the upper surface of the second wedge member is parallel with the upper surfaces of one or both of the first and third wedge members when the device is in the second configuration.

23. A releasable clamping device, comprising:
first, second, third, fourth, and fifth wedge members that are longitudinally aligned, such that the first wedge member makes sliding contact with the second wedge member, the second wedge member makes sliding contact with the third wedge member, the third wedge member makes sliding contact with the fourth wedge member, and the fourth wedge member makes sliding contact with the fifth wedge member;
wherein first wedge member comprises a finger that slidingly extends within a void defined by the second wedge member, and the second wedge member comprises a finger that slidingly extends within a void defined by the first wedge member, wherein an axis through the finger of the first wedge member is parallel to an axis through the finger of the second wedge member, and wherein the axes through the fingers of the first and second wedge members are both aligned at a first acute angle with respect to a vertical axis through the third wedge member;
wherein the fourth wedge member comprises a finger that slidingly extends within a void defined by the fifth wedge member, and the fifth wedge member comprises a finger that slidingly extends within a void defined by the fourth wedge member, wherein an axis through the finger of the fourth wedge member is parallel to an axis through the finger of the fifth wedge member, and wherein the axes through the fingers of the fourth and fifth wedge members are both aligned at a second acute angle with respect to the vertical axis through the third wedge member;
further comprising an input that extends through the first, second, third, fourth, and fifth wedge members, wherein movement of the input in a first direction directs a first force to the finger of each of the second and fourth wedge members in a first direction with a vertical vector component toward an upper surface of each respective second and fourth wedge member to urge the second and fourth wedge members to translate vertically with respect to the first, third, and fifth wedge members such that the upper surfaces of the second and fourth wedge members are vertically above upper surfaces of the first, third, and fifth wedge members,
wherein movement of the input in a second direction opposite from the first direction directs an opposite second force to the finger of each of the second and fourth wedge members in a second direction with a vector component toward a lower surface of each respective second and fourth wedge member, opposite the respective upper surface, to urge the second and fourth wedge members to translate vertically with respect to the first, third, and fifth wedge members such that the upper surfaces of the second and fourth wedge members move toward an orientation where the upper surfaces of the first, second, third, fourth, and fifth wedge members extend through a single plane.

24. The releasable clamping device of claim 23, wherein the input is a rotatable shaft, wherein the first wedge member receives one or more pins that extend within a recess defined in an outer surface of the shaft, such that longitudinal movement of the shaft with respect to the first wedge member is prevented with rotation of the shaft.

25. The releasable clamping device of claim 24, wherein the fifth wedge member comprises a threaded hole that receives a threaded portion of the shaft, wherein rotation of the shaft in the first direction urges the first and fifth wedge members toward each other, and rotation of the shaft in the second direction urges the first and fifth wedge members away from each other.

26. The releasable clamping device of claim 24, wherein the second and fourth wedge members each comprise a longitudinal slot that extends therethrough with the shaft extending through each longitudinal slot, wherein each longitudinal slot provides space for the second and fourth wedge members to slide vertically with respect to the shaft as the shaft is rotated in the first and second directions.

27. The releasable clamping device of claim 23, wherein each of the respective fingers fill the respective opposing voids when the shaft is fully rotated in the second direction such that a top planar surface of each respective finger contacts a planar lower surface establishing the respective void on the opposing wedge member.

28. The releasable clamping device of claim 27, wherein each of the respective fingers slides partially out of the respective opposing voids when the shaft is fully rotated in the first direction such that the top planar surface of each respective finger is spaced from the lower planar surface establishing the respective void on the opposing wedge member.

29. The releasable clamping device of claim 23, wherein the retaining device is configured to be disposed between a portion of a printed circuit board and a rigid surface, wherein the retaining device fixes the printed circuit board with respect to the rigid surface when input is moved fully in the first direction, and wherein the device frees the printed circuit board from the rigid case when the input is moved fully in the second direction.

30. The releasable clamping device of claim 23, wherein the input is a threaded shaft that extends from the first wedge member and an elongate bar that extends through the second, third, fourth, and fifth wedge members, wherein rotation of the shaft causes the elongate bar to slide with respect to the first, second, third, and fourth wedge members, and wherein the bar is fixed with respect to the fifth wedge member.

31. The releasable clamping device of claim 1, wherein the second inclined surface of the first wedge member is in sliding contact with the second inclined surface of the second wedge member as the second wedge member transitions to the first configuration from the second configuration.

32. The releasable clamping device of claim 9, wherein rotation of the threaded shaft causes the threaded shaft and the first wedge member to slide longitudinally toward or away from the third wedge member.

33. The releasable clamping device of claim 32, wherein the threaded shaft is fixed to the first wedge member.

* * * * *

UNITED STATES PATENT AND TRADEMARK OFFICE
CERTIFICATE OF CORRECTION

PATENT NO. : 10,182,509 B1  
APPLICATION NO. : 15/968115  
DATED : January 15, 2019  
INVENTOR(S) : Moses Ray Jensen et al.

Page 1 of 1

It is certified that error appears in the above-identified patent and that said Letters Patent is hereby corrected as shown below:

In the Claims

At Claim 17, Column 16, Line 44, please insert --the-- after "of" and before "fifth"

Signed and Sealed this  
Twelfth Day of March, 2019

Andrei Iancu  
*Director of the United States Patent and Trademark Office*